US008999860B2

(12) United States Patent
Larrey et al.

(10) Patent No.: US 8,999,860 B2
(45) Date of Patent: Apr. 7, 2015

(54) PROCESS FOR PRODUCING AT LEAST ONE SILICON-BASED NANOELEMENT IN A SILICON OXIDE SECTION AND PROCESS FOR THE MANUFACTURE OF A DEVICE EMPLOYING THE PRODUCTION PROCESS

(71) Applicant: Commissariat a l'energie Atomique et aux Energies Alternatives, Paris (FR)

(72) Inventors: Vincent Larrey, La Murette (FR); Laurent Vandroux, Le Cheylas (FR); Audrey Berthelot, St Ismier (FR); Marie-Helene Vaudaine, Seyssins (FR)

(73) Assignee: Commissariat a l'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/133,847

(22) Filed: Dec. 19, 2013

(65) Prior Publication Data
US 2014/0179089 A1 Jun. 26, 2014

(30) Foreign Application Priority Data

Dec. 20, 2012 (FR) .................................. 12 62446

(51) Int. Cl.
H01L 21/31 (2006.01)
H01L 21/02 (2006.01)
B82Y 10/00 (2011.01)
B82Y 40/00 (2011.01)
H01L 29/06 (2006.01)

(52) U.S. Cl.
CPC ........... *H01L 21/02664* (2013.01); *B82Y 10/00* (2013.01); *B82Y 40/00* (2013.01); *H01L 21/02532* (2013.01); *H01L 29/0676* (2013.01); *H01L 21/02595* (2013.01); *H01L 21/02107* (2013.01)

(58) Field of Classification Search
USPC .......... 438/761, 762, 765, 766, 769, 770, 771
See application file for complete search history.

(56) References Cited

U.S. PATENT DOCUMENTS 7,211,464 B2 * 5/2007 Lieber et al. .................... 438/99
7,367,215 B2 * 5/2008 Monty et al. .................... 73/23.2
2011/0274882 A1 * 11/2011 Wallace et al. ............... 428/166

OTHER PUBLICATIONS

Search Report prepared by French Patent Office for Priority application FR 1262446 dated Sep. 26, 2013.
Matovic, Jovan et al.: "Nanomembrance: A New MEMS/NEMS Building Block", *Micro Electronic and Mechanical Systems*, Dec. 2009, pp. 61-84.
Dhara, Soumen et al.: "Self-catalytic growth of horizontal and straight Si nanowires on Si substrates using a sputter deposition technique", *Solid State Communications*, 150, (2010), pp. 1923-1987.
Mohammad, S. Noor: "Investigation of the oxide assisted growth mechanism for nanowire growth and a model for this mechanism", *J. Vac. Sci. Technol*, B 26(6), Nov./Dec. 2008, pp. 1993-2007.
Wang, N. et al.: "Growth of nanowires", *Materials Science and Engineering*, R 60 (2008), pp. 1-51.

* cited by examiner

*Primary Examiner* — Kevin M Picardat
(74) *Attorney, Agent, or Firm* — Frommer Lawrence & Haug LLP; Ronald R. Santucci

(57) ABSTRACT

The process for the production of at least one silicon-based nanoelement (4), in particular a nanowire, comprises the following stages: providing a substrate comprising, at the surface, a first layer (1) comprising electrically doped silicon; forming, on the first layer (1), a second layer (2) based on silicon oxide with carbon atoms (3) dispersed in the said second layer (2); and exposing the first and second layers (1, 2) to an oxidizing atmosphere, so as to oxidize at least a first section (1a) of the first layer (1) at the interface of the said first layer (1) with the second layer (2) and to form the said at least one nanoelement (4) at the said first section (1a).

15 Claims, 3 Drawing Sheets

PROCESS FOR PRODUCING AT LEAST ONE SILICON-BASED NANOELEMENT IN A SILICON OXIDE SECTION AND PROCESS FOR THE MANUFACTURE OF A DEVICE EMPLOYING THE PRODUCTION PROCESS

TECHNICAL FIELD OF THE INVENTION

The invention relates to the field of nanotechnologies.
The subject-matter of the invention is more particularly a process for producing a silicon-based nanoelement or a plurality of silicon-based nanoelernents.

STATE OF THE ART

The majority of processes for producing nanowires or nanoelements require a metal precursor. For example, droplets of the precursor are formed on a substrate so as to make possible, under a controlled atmosphere, the growth of nanowires at the interface between the substrate and each droplet. This results in contamination by metal, which prevent these nanowires being used in a subsequent process incompatible with the said contamination.

There thus exists a need to form silicon-based nanowires without use of metal precursors.

SUBJECT-MATTER OF THE INVENTION

The aim of the present invention is to provide a solution which overcomes the disadvantage listed above.

This aim is approached in particular in that the process for producing at least one silicon-based nanoelement, in particular a nanowire, comprises the following stages: providing a substrate comprising, at the surface, a first layer comprising electrically doped silicon; forming, on the first layer, a second layer based on silicon oxide with carbon atoms dispersed in the said second layer; and exposing the first and second layers to an oxidizing atmosphere, so as to oxidize at least a first section of the first layer at the interface of the said first layer with the second layer and to form the said at least one nanoelement at the said first section.

Advantageously, the silicon of the first layer is polycrystalline silicon.

Preferably, the process comprises a stage of n-type electrical doping of the first layer by a phosphorous with a concentration of between $10^{19}$ at.cm$^{-3}$ and $2\times10^{20}$ at.cm$^{-3}$, limits included.

According to one embodiment, the process comprises, before the doping of the first layer, a stage of determination of the desired concentration of the dopant in the first layer so as to obtain a predetermined density of nanoelements following the exposure stage.

According to a first example, the stage of formation of the second layer is carried out by using a carbon-comprising precursor, in particular TétraEthOxySilane, the plasma enhanced chemical vapor deposition technique being used.

According to a second preferred example, the stage of formation of the second layer is carried out by using a precursor which does not comprise carbon; in particular, the precursor is silane, and by incorporating carbon, in particular carbon dioxide.

Advantageously, the exposure stage comprises a stage of maintaining an oxidation temperature to which the first and second layers are subjected and a stage of injection of an oxidizing gas, in particular oxygen, into an oxidation chamber in which the first and second layers are placed. The exposure stage can be carried out for a predetermined period of time which is a function of the conditions of temperature and of use of the oxidizing gas.

According to one embodiment, as the said nanoelement is covered at least in part following its formation during the exposure stage, the process comprises a stage of freeing at least a covered part of the said nanoelement.

According to one example, the freeing stage comprises a stage of removal of the silicon oxide of the second layer and of the oxidized part of the first section as far as a second nonoxidized section resulting from the first layer from which extends the said at least one nanoelement.

According to another example, the freeing stage comprises a stage of planing down at least the second layer so as to release an end of the said at least one nanoelement.

The invention also relates to a process for the manufacture of an electronic device provided with at least one functionalized nanoelement, the said process comprising: a stage of carrying out the production process as described, so as to form the said at least one nanoelement, and a stage of functionalization of the said at least one nanoelement, so as to create an electrical interaction of the said at least one nanoelement with another element of the device.

Preferably, if the said production process comprises a stage of planing down at least the second layer so as to release an end of the said at least one nanoelement, the functionalization stage comprises the relocation of a part of the device at the said released end so as to combine, with the said released end, the said other element of the device.

Preferably, if the said production process comprises a stage of freeing at least a covered part along the said nanoelement between two of its opposite longitudinal ends, the functionalization stage comprises a stage of deposition of a layer intended to form the said other element of the device on at least a portion of the said at least a freed part of the nanoelement.

According to one embodiment, as the said at least one nanoelement is combined with a first substrate and as the said other element is combined with a second substrate distinct from the first substrate, the process comprises a stage of transfer of one of the substrates onto the other so as to combine the said at least one nanoelement with the said other element.

BRIEF DESCRIPTION OF THE DRAWINGS

Other advantages and characteristics will more clearly emerge from the description which will follow of specific embodiments of the invention given by way of nonlimiting examples and represented on the appended drawings, in which.

DESCRIPTION OF PREFERRED FORMS OF THE INVENTION

The process described below differs from the prior art in particular in that the nanoelement is obtained during an oxidation of a silicon layer under specific conditions.

In the present description, when an element is based on a material, this means that this material is the major component present, with respect to other materials making up the said element, or that it constitutes the said element.

The term "nanoelement" or "nanowire" in the continuation of the description preferably means a three-dimensional structure of elongated shape, the longitudinal dimension of which is at least equal to 10 times the transverse dimension or dimensions, preferably at least 50 times and more preferably still at least 100 times. The transverse dimension or dimensions are between 1 nm and 20 nm. In some embodiments, the transverse dimensions can be less than or equal to approximately 10 nm, preferably of between 1 nm and 5 nm. In some embodiments, the height of each nanowire can preferably be greater than or equal to 50 nm.

Figure 1:
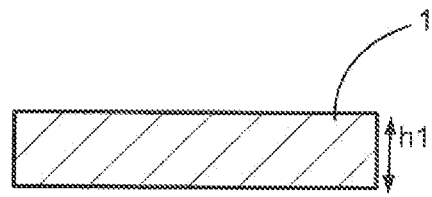
FIGS. 1 to 3 illustrate various cross-sectional views of various stages of implementation of the process for producing the said at least one nanoelement.
Figure 2:
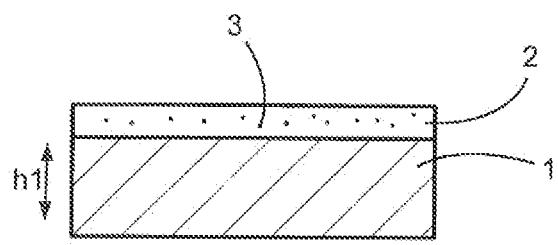
Figure 3:
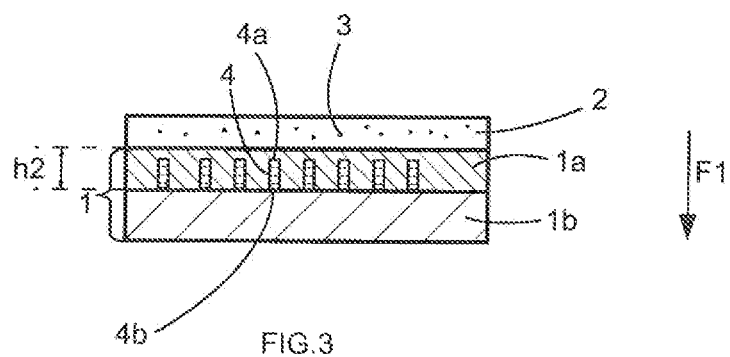

As illustrated in FIGS. 1 to 3, the process for producing at least one silicon-based nanoelement, in particular a nanowire, comprises a stage in which there is provided a substrate comprising at least, at the surface, a first layer 1 comprising electrically doped silicon. The doping can be of n or p type, in particular such that the first layer 1 is electrically conducting (for example of degenerate silicon).

The first layer 1 can result from the deposition of a layer, for example of polysilicon, at the surface of a supporting substrate (not represented), for example made of silicon. In this case, the electrical doping can take place during the deposition or after the deposition of the said first layer, for example by implantation.

In an alternative form, the first layer 1 can result from the doping at the surface of a bulk substrate formed of monocrystalline or polycrystalline silicon.

The first layer 1 can have a thickness h1 of between 100 nm and 1 μm, limits of his range of thickness included.

In addition, the process comprises a stage of formation, on the first layer 1, of a second layer 2 (FIG. 2) based on silicon oxide with carbon atoms 3 dispersed in the second layer 2. Silicon oxide of formula $SiO_x$ (under stoichiometric or non-stoichiometric conditions, typically with $0<x\leq2$ and advantageously $1.8\leq x\leq2$) is also known as silicon dioxide or silica.

Finally, the process comprises a stage in which the first and second layers 1, 2 are exposed to an oxidizing atmosphere, so as to oxidize (FIG. 3) at least a first section 1a of the first layer 1 at the interface of the said first layer 1 with the second layer 2 and to form the said at least one nanoelement 4 at the said first section 1a. In fact, this formation of the nanoelement 4 takes place in the first section 1a, each nanoelement can then be covered, at least in part, with silicon oxide forming the first section 1a.

The term "section" is understood to mean a part of a layer along its thickness. In other words, with reference to FIG. 3, a section is included in a plane substantially or exactly perpendicular to the arrow F1. The plane including a section is thus substantially or exactly parallel to the plane including the layer from which the section results (corresponding, if appropriate, to the plane of the supporting substrate).

The height h2 of the first section 1a depends on the height desired for the nanoelement 4. This is because the height h2 is slightly greater than that of the nanoelement 4 as a result of the expansion of the silicon during its oxidation. Thus, the nanoelement 4 can extend between a second nonoxidized section 1b remaining from the first initial layer 1 until close to the second layer 2.

In other words, it is the oxidation of the first layer 1 which unexpectedly generates one or more nanoelements 4 at the said first section 1a when the conditions of doped substrate, of layer made of silicon oxide comprising carbon atoms and of exposure to the oxidizing atmosphere which are targeted above are combined.

Preferably and applicable to the various implementations the silicon of the first layer 1 is polycrystalline silicon but the invention also applies to monocrystalline silicon as first layer 1. Nevertheless, the greater the density of grain boundaries, the greater the density of the nanoelements 4, these nanoelements being located preferably but not exclusively at the grain boundaries.

In the present description, the term "density" is understood to mean the number of nanoelements 4 for a given unit of surface area, for example $cm^2$.

Advantageously, the process comprises a stage of electrical doping, in particular of the silicon, of the said first layer 1, in particular of n type, by phosphorous, preferably with a concentration of between $10^{19}$ at.cm$^{-3}$ and $2\times10^{20}$ at.cm$^{-3}$, limits included.

The doping of the silicon of the first layer 1 is important insofar as, if a doping is not carried out, formation of nanoelement(s) is not observed during the exposure stage during which the first section 1a is formed. Furthermore, it has been found that the variation in the doping of the silicon could bring about a variation, independently of the remaining conditions of the process, in the density of appearance of nanoelements 4 during the exposure stage. Thus, the greater the doping, the greater the density of nanoelements 4. Thus, the process can advantageously comprise, before the (electrical) doping of the first layer 1, a stage of determination of the concentration desired for the dopant in the first layer 1, in particular in the silicon of the first layer, so as to obtain a predetermined density of nanoelements 4 following the exposure stage.

In particular, the one skilled in the art may be able to adjust said doping (doping of the silicon of the first layer) depending of desired density of nanoelements. Preferably, the doping may have a concentration of between $10^{18}$ at.cm$^{-3}$ and $10^{21}$ at.cm$^{-3}$, preferably of between $10^{19}$ at.cm$^{-3}$ and $5\times10^{20}$ at.cm$^{-3}$, and for example of between $10^{19}$ at.cm$^{-3}$ and $10^{20}$ at.cm$^{-3}$.

As mentioned above, the second layer based on silicon oxide must comprise carbon. This carbon can be introduced during a deposition of the second layer 2 or after the deposition of the second layer 2, for example by implantation. It is thus understood that the stage of formation can comprise a stage of deposition producing the second layer in which carbon atoms are dispersed or a stage of deposition of an intermediate layer, followed by a stage of implantation which makes possible the dispersion of carbon atoms in the intermediate layer, so as to form, after dispersion, the said second layer. These carbon atoms 3 are also important insofar as, if the second layer 2 did not comprise carbon atoms 3, formation of nanoelement(s) during the exposure stage is not observed. The greater the amount of carbon, the greater the density of nanoelements 4. Furthermore, beyond a certain carbon threshold, it has been found that the nanoelements 4 could even agglomerate within the oxide.

Preferably, the second layer 2 comprises a minimal atomic percentage of carbon of 0.1%, for example greater than 0.2% or 0.4% or 0.5% and a maximum atomic percentage carbon for example lower than 10% or 5%.

These carbon atoms 3 can be introduced in several different ways, in particular in a controlled chamber for the deposition of the second layer 2.

In a first example which makes possible the presence of the carbon atoms 3 in the second layer 2, the stage of formation of the second layer 2 is carried out, in particular by deposition, using a carbon-comprising precursor, in particular Tetra-EthOxySilane (TEOS), the plasma enhanced chemical vapor deposition technique (PECVD) being used. The PECVD technique is preferred in the context of the combination with TEOS as it makes it possible to more easily break down the molecules in order to make possible the presence of carbon atoms 3 in the second layer 2. Typically, the combination of low pressure chemical vapor deposition (LPCVD) with TEOS is not sufficient to obtain the presence of carbon atoms 3 in the second layer 2.

A person skilled in the art can, in order to produce this layer 2 comprising carbon atoms, use standard formulas for the deposition of oxide and adapt the process to his liking. By way of example, for a reactor known under the name "P5000B Lamp Heated", use may be made of the following conditions: pressure 7.2 Torr, power 750W, 230 mils of inter-electrode distance, 1000 sccm of helium, 1200 sccm of TEOS and 1000 sccm of oxygen at 400° C. Under these conditions, 1 micrometer of oxide forming the second layer 2 provided with carbon atoms is obtained in 74 seconds.

In a "Centura E reactor DXZ", the following conditions can be observed: 8.2 Torr, 910W, 240 mils, 1000 sccm of helium, of TEOS and of oxygen, 400° C.; a rate of deposition of 750 nm/minute is then obtained.

A mil is a unit of measurement and represents a thousandth of an inch (25.4 micrometers).

For the experiments carried out in PECVD with TEOS, the atomic percentage of carbon obtained in the second layer 2 is less than 1%.

In a second example which makes possible the presence of the carbon atoms 3 in the second layer 2, the stage of formation of the second layer 2 can be carried out, in particular by deposition, by using a precursor which does not comprise carbon; in particular, the precursor is silane, and by incorporating carbon, in particular carbon dioxide, for example in the form of a gas, in the chamber for deposition of the second layer 2. This second example will be preferred insofar as it makes it possible to quantitatively determine the amount of carbon, whereas the TEOS does not make it possible as it comprises a predetermined amount of carbon which cannot be adjusted.

A person skilled in the art can, in order to produce the second layer 2 according to this second example, use standard formulas for the deposition of oxide and adapt the process to his liking. By way of example, in a Centura D reactor DXZ device (2.7T, 400W, 460 mils, 400° C.), it is possible to vary the gas ratios in the following way: 1900 sccm $CO_2$, 20 sccm $SiH_4$; 1900 sccm $CO_2$, 37 sccm $SiH_4$; 1900 sccm $CO_2$, 100 sccm $SiH_4$. 400 nm of oxide is obtained for 20 sccm of $SiH_4$ in 134s, for 37 sccm in 82s and for 100 sccm in 50 s.

The greater the amount of carbon, the greater the content of nanoelements. Thus, for the final gas ratio of the list of ratios, the nanoelements are no longer distinct in the oxide matrix (section 1a) but agglomerate to form a matrix of nanoelements in the oxide matrix.

As indicated above, it is during the exposure stage bringing about the formation of the first section 1a by oxidation of the first layer 1 that each nanoelement 4 is formed. In other words, it can be considered that the exposure stage comprises a stage of growth of the said at least one nanoelement 4 in the said first section 1a during its formation, the growth of the said at least one nanoelement 4 being carried out in a direction orientated opposite that of the second layer 2. In fact, during the formation of the first section 1a, the thickness along the arrow F1 of FIG. 3 of the first section 1a increases as the operation proceeds, whereas that of a second section 1b corresponding to the remainder of the first layer 1 consequently decreases. The said nanoelement 4 then extends between two opposite longitudinal ends 4a, 4b (FIG. 3) within a silicon oxide matrix and one of the ends 4b is in contact with the second section 1b (in particular at the oxidation front), the other end 4a being encountered close to the second layer 2 the spacing from this second layer 2 resulting from the expansion of the silicon during its oxidation). Preferably, between its two ends 4a and 4b, the nanoelement 4 is embedded in the silicon oxide matrix of the first section 1a.

The stage of the exposure to the oxidizing atmosphere makes it possible to densify the second layer 2 while oxidizing the first layer 1, partially or completely, by diffusion through the second layer 2. Thus, it is the oxidizing entities of the oxidation atmosphere which diffuse through the second layer 2 in order to oxidize the section 1a.

The oxidizing atmosphere comprises oxygen. Typically, for a dry oxidation, the oxidizing atmosphere comprises, for example, 99% of oxygen for 1% of nitrogen. In wet oxidation, the oxidation can be obtained conventionally using a plasma torch.

Advantageously, the exposure stage comprises a stage of maintaining an oxidation temperature to which the first and second layers 1, 2 are subjected and a stage of injection of an oxidizing gas, in particular oxygen, into an oxidation chamber in which the first and second layers 1, 2 are placed. The oxidation temperature can be between 950° C. and 1200° C. and preferably of the order of or equal to 1050° C. For example, the exposure stage can be carried out for a predetermined period of time which depends on the conditions of temperature and of use of the oxidizing gas and preferably of the thickness of the first layer 1 and on the desired thickness of oxidation in the first layer. A person skilled in the art is then capable of adjusting the present process to his liking.

For example, for a second layer 2 of oxide of 400 nm and in order to oxidize approximately 100 nm of polysilicon, the following conditions can be used: 1050° C. for 3 h in a dry atmosphere or 1050° C. for 30 minutes in a wet atmosphere.

The exposure stage can be carried out using dry or wet oxidation techniques. The duration of the exposure stage then depends on the technique chosen. Typically, in the event of exposure according to the dry technique, the said duration will be greater than that of the exposure with the wet technique.

The exposure stage can also be such that all the first layer 1 is oxidized.

It is thus possible to obtain electrically conducting nanoelements in an insulating matrix of oxide. For nanoelements (nanowires) obtained with a cross-sectional diameter of the order of 10 nm and with a height of approximately 80 nm, a resistance of between $10^7$ and $10^8$ ohms could be measured.

After the exposure stage, the nanoelement 4 is not generally directly accessible as it is completely coated. This thus results in a problem of accessibility of the said nanoelement 4. In other words, as illustrated in FIG. 3, the said nanoelement 4 can be covered, at least in part, following its formation during the exposure stage, and the process can comprise a stage of freeing at least a covered part of the said nanoelement 4. In fact, with regard to the specific and nonlimiting example of FIG. 3, the nanoelement 4 is completely coated, on the one hand, by silicon oxide resulting from the layer 2 and from the exposure stage which has resulted in the formation of the first section 1*a* and, on the other hand, by a part of the second section 1*b* from which it rises following the exposure stage.

Figure 4:
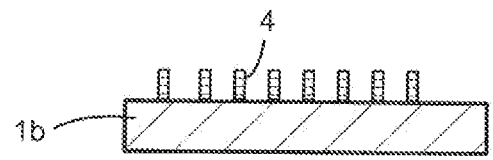
FIGS. 4 and 5 illustrate, seen in cross-section, two different embodiments for releasing the said at least one nanoelement.

According to a first implementation, the freeing stage can comprise a stage of removal of the silicon oxide of the second layer 2, for example, selectively with respect to the said at least one nanoelement in particular a stage of removal of all of the second layer 2) and of the oxidized part of the first section 1*a* as far as the nonoxidized second section 1*b* resulting from the first layer 1 from which the said at least one nanoelement 4 extends. The result of such a removal is visible in FIG. 4. This removal can be carried out by vapour HF (hydrogen fluoride) or HF chemical selective etching. Furthermore, alternatively, the oxidized part of the first section 1*a* may not be removed as far as the second section 1*b* as long as an accessible portion of the nanoelement 4 is of satisfactory dimensions.

Figure 5:
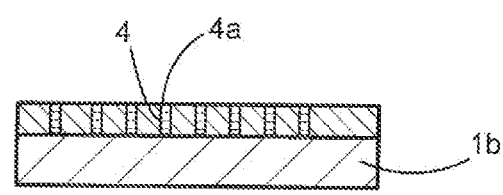

According to a second implementation, the freeing stage can comprise a stage of planing down at least the second layer 2 so as to release an end 4*a* of the said at least one nanoelement 4. In fact, the second layer 2 and a part of the section 1*a* can be planed down before making possible access to the end 4*a*. After planing down, the end 4*a* of the nanowire remains free and accessible (FIG. 5). This stage of planing down can be carried out by CMP (Chemical Mechanical Polishing).

Figure 6:
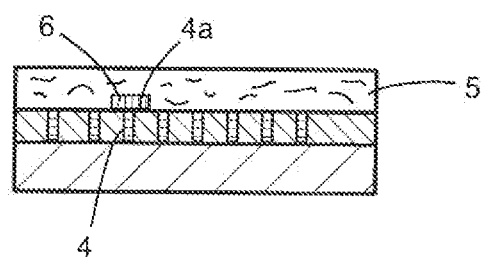
FIGS. 6 and 7 illustrate, seen in cross-section, two different embodiments of the process for the manufacture of an electronic to device.

It can be advantageous, for some applications, to relocate the said at least one nanoelement 4 on another support (substrate), for example another support on which it is impossible to bring about the growth of a silicon-based nanoelement 4. As described above, the said at least one nanoelement is obtained naturally coated in a matrix of silicon oxide (FIG. 3) and a relocation of this layer comprising the said at least one nanoelement 4 on another support is this facilitated. In FIG. 6, this other support can be represented by the element referenced 5. This relocation can be carried out by the known relocating means, for example direct bonding or bonding via a polymer. In an advantageous process, this relocation can be carried out after the operation of planing down targeted at releasing an end 4*a* of the said at least one nanoelement 4. It will then advantageously be possible to eliminate, if appropriate, the supporting substrate and the non-oxidized remainder 1*b* of the first layer 1 by one of the following processes or a combination of the following processes: deep etching, grinding, CMP (Chemical Mechanical Polishing) or wet chemical etching (for example by TMAH). The end of the removal will advantageously be carried out by a selective process which will not etch the matrix silicon oxide in which the nanoelements are present. The said at least one nanoelement can thus then be freed by the techniques described above completely or partially.

The invention also relates to a process for the manufacture of an electronic device provided with at least one functionalized nanoelement. Such a process can advantageously comprise a stage of carrying out the production process as described, so as to form the said at least one nanoelement, and a stage of functionalization of the said at least one nanoelement, so as to create an electrical interaction of the said at least one nanoelement with another element of the device.

For example, as the production process comprises a stage of planing down at least the second layer 2, so as to release an end 4*a* of the said at least one nanoelement 4, the functionalization stage can comprise the relocation of a part 5 of the device at the said released end 4*a*, so as to combine, with the said released end 4*a*, the said other element 6 of the device (FIG. 6). After relocation, the said part 5 can be bonded, in particular to another part comprising the nanoelement 4, so as to maintain the combination between the nanoelement and the other element 6 of the device.

Figure 7:
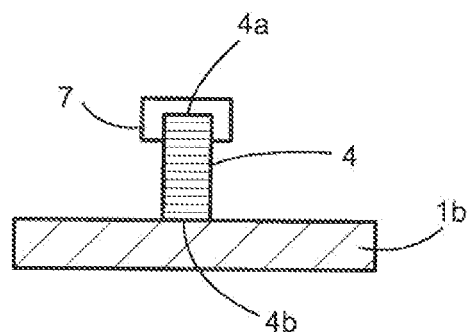

According to another example (FIG. 7), as the said production process comprises a stage of freeing at least a covered part along the said nanoelement 4 between two of its opposite longitudinal ends 4*a*, 4*b*, the functionalization stage comprises a stage of deposition of a layer 7 intended to form the said other element of the device on at least a portion of the said at least one freed part of the nanoelement 4 or at a free end 4*a* of the said nanoelement 4.

Furthermore, if the said at least one nanoelement is combined with a first substrate and if the said other element is combined with a second substrate distinct, from the first substrate, then the process can comprise a stage of transfer of one of the substrates onto the other, so as to combine the said at least one nanoelement with the said other element.

Of course, the invention also relates to one or mare nanoelements obtained according to the production process and/or to an electronic device resulting from the process of the manufacture of the electronic device.

The processes described above make it possible to avoid the use of metal precursors for the growth of the nanoelements. Furthermore, in some applications (for example, transfer of nanoelements from a substrate A to a substrate B), it can be advantageous to coat the nanoelements in order to obtain, for example, a layer of electrically insulating matrix comprising electrically conducting or semiconducting nanoelements. Consequently, according to the process described above, this coating is automatically carried out during the formation of the nanoelements, making it possible to eliminate a technological stage of coating subsequent to the formation of the nanoelements. Furthermore, once the nanoelements are created by the means known from the prior art, it is problematic to coat them without modifying their properties; the process provided here makes it possible to overcome this disadvantage.

In the present desorption, the term "nanoelement" can be replaced by "nanoelements". Thus, everything which is said above applies, replacing the said at least one nanoelement with a plurality of nanoelements. In the same way, each nanoelement can in fact be a silicon-based nanowire.

The process according to the invention can make it possible to obtain a plurality of unconnected nanoelements which are substantially parallel to one another and perpendicular to the plane of substrate. It is also possible to obtain a porous silicon-based material. This is because, as explained above, if the density of nanoelements is too high (in particular if the amount of carbon introduced into the layer 2 is high), the nanoelements agglomerate to form a matrix within the oxide matrix (silicon oxide of the section 1*a*). It is subsequently possible to selectively remove this oxide matrix (for example by vapour HF or HF chemical selective etching). A porous silicon-based structure is then obtained. Like all the porous structures, this structure exhibits a high expanded surface area which can be put to advantage in numerous applications, in particular gas detection, for example.

Figure 8:
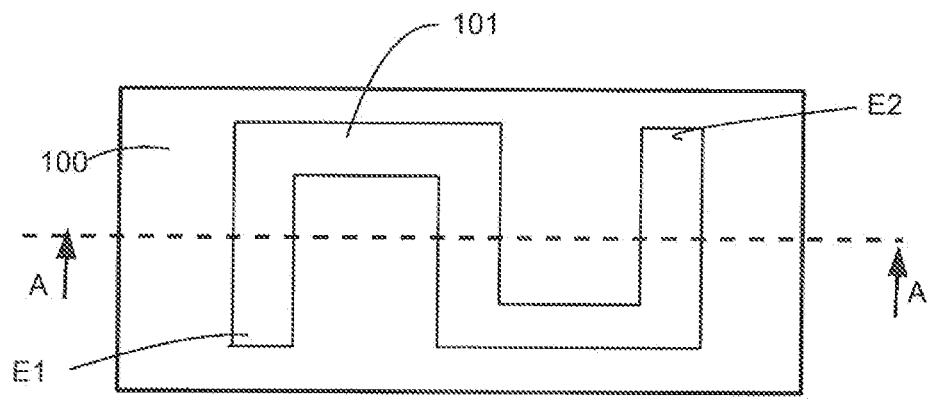
FIG. 8 illustrates a specific embodiment exhibiting a substrate provided with a trench in the form of a serpentine pattern.
Figure 9:
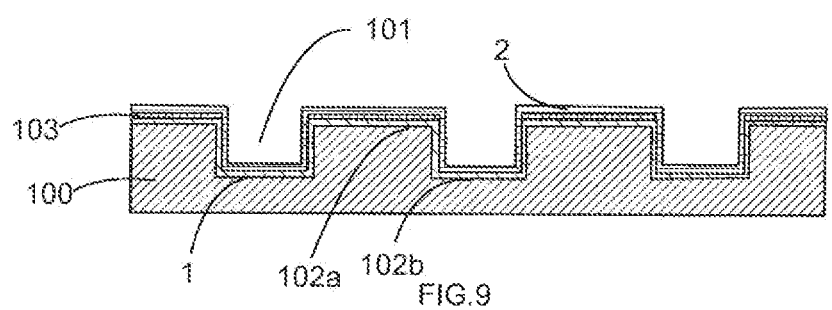
FIG. 9 illustrates a cross-sectional view along A-A of FIG. 8 on which technological stages of deposition of layers have been carried out, FIG. 10 exhibits a gas detection device using a part of FIG. 9 and closed by a cover.
Figure 10:
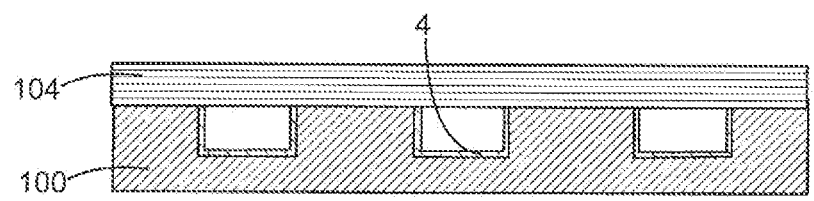

Thus, according to a specific example illustrated in FIGS. 8 to 10, it is possible to etch, in a silicon substrate 100, a serpentine pattern 101 (with a depth of the order of 100 microns), in order to create a cavity delimited by a raised design with top parts 102*a* and hollowed-out parts 102*b*. Subsequently, there is deposited, at the surface of the etched face of the substrate 101, the first layer 1 of doped polycrystalline silicon (advantageously doped with phosphorous) with a thickness of the order of 1 micron, as described above. A mask 103 (for example of nitride) is then deposited, by standard techniques, on (preferably only on) the top parts 102a of the raised design covered with the first layer 1. The layer of silicon oxide (corresponding to the second layer 2) comprising carbon as described above (for example with a thickness of 400 nm) is subsequently deposited; this deposited layer can cover the mask 103 and the remainder of the first layer 1 not covered by the mask 103. The stage of exposure to the oxidizing atmosphere is then carried out, so as to perform the oxidation of the polysilicon layer (first layer 1) through the oxide layer (second layer 2). This oxidation only takes place in the hollowed-out parts 102b since the presence of the mask 103 (nitride) at the top parts 102a prevents the oxidation from taking place at this level. The nanoelements 4 are thus created at the bottom of the cavity and also on walls of the cavity corresponding to the hollowed-out parts 102b. If the amount of carbon is high, the nanoelements 4 agglomerate. It is then possible to selectively remove the oxide (that is to say, the oxide layer 2 and the oxidized part of the first layer 1, for example the oxidized polysilicon) and the nitride mask 103 and preferably the first layer 1 at the top parts 102a, in order to obtain cavities, for which the surface (walls and bottom) is covered with a porous silicon-based layer (agglomerate of silicon-based nanoelements). It is subsequently possible to close the cavities by relocating a cover 104 of the surface. By inserting a pathway between an inlet and an outlet at the opposite ends E1 and E2 (FIG. 8) of the starting serpentine pattern, it is then possible to circulate, in the serpentine pattern thus "embedded", a gas or a fluid to be analysed by using the nanoelements 4, for example in the context of application to gas detection or analysis.

The invention claimed is:

1. Process for producing at least one silicon-based nanoelement, in particular a nanowire, which comprises the following stages:
   providing a substrate comprising, at the surface, a first layer comprising electrically doped silicon,
   forming, on the first layer, a second layer based on silicon oxide with carbon atoms dispersed in the said second layer,
   exposing the first and second layers to an oxidizing atmosphere, so as to oxidize at least a first section of the first layer at the interface of the said first layer with the second layer and to form the said at least one nanoelement at the said first section.

2. Process according to claim 1, wherein the silicon of the first layer is polycrystalline silicon.

3. Process according to claim 2, wherein it comprises a stage of n-type electrical doping of the first layer by a phosphorus with a concentration of between $10^{19}$ at.cm$^{-3}$ and $2\times10^{20}$ at.cm$^{-3}$, limits included.

4. Process according to claim 1, wherein it comprises, before the doping of the first layer, a stage of determination of the desired concentration of the dopant in the first layer so as to obtain a predetermined density of nanoelements following the exposure stage.

5. Process according to claim 1, wherein the stage of formation of the second layer is carried out by using a carbon-comprising precursor, in particular TetraEthOxySilane, the plasma enhanced chemical vapor deposition technique being used.

6. Process according to claim 1, wherein the stage of formation of the second layer is carried out by using a precursor which does not comprise carbon; in particular the precursor is silane, and by incorporating carbon, in particular carbon dioxide.

7. Process according to claim 1, wherein the exposure stage comprises a stage of maintaining an oxidation temperature to which the first and second layers are subjected and a stage of injection of an oxidizing gas, in particular oxygen, into an oxidation chamber in which the first and second layers are placed.

8. Process according to claim 7, wherein the exposure stage is carried out for a predetermined period of time which is a function of the conditions of temperature and of use of the oxidizing gas.

9. Process according to claim 1, wherein, as the said nanoelement is covered at least in part following its formation during the exposure stage, the process comprises a stage of freeing at least a covered part of the said nanoelement.

10. Process according to claim 9, wherein the freeing stage comprises a stage of removal of the silicon oxide of the second layer and of the oxidized part of the first section as far as a second nonoxidized section resulting from the first layer from which extends the said at least one nanoelement.

11. Process according to claim 9, wherein the freeing stage comprises a stage of planing down at least the second layer so as to release an end of the said at least one nanoelement.

12. Process for the manufacture of an electronic device provided with at least one functionalized nanoelement, wherein it comprises:
   a stage of carrying out the production process according to claim 1, so as to form the said at least one nanoelement,
   a stage of functionalization of the said at least one nanoelement, so as to create an electrical interaction of the said at least one nanoelement with another element of the device.

13. Process according to claim 12, wherein, as the said production process comprises a stage of planing down at least the second layer so as to release an end of the said at least one nanoelement, the functionalization stage comprises the relocation of a part of the device at the said released end so as to combine, with the said released end, the said other element of the device.

14. Process according to claim 12, wherein the said production process comprises a stage of freeing at least a covered part along the said nanoelement between two of its opposite longitudinal ends and in that the functionalization stage comprises a stage of deposition of a layer intended to form the said other element of the device on at least a portion of the said at least a freed part of the nanoelement.

15. Process according to claim 12, wherein, as the said at least one nanoelement is combined with a first substrate and as the said other element is combined with a second substrate distinct from the first substrate, the process comprises a stage of transfer of one of the substrates onto the other so as to combine the said at least one nanoelement with the said other element.

* * * * *